United States Patent
Yu

(10) Patent No.: US 8,669,554 B2
(45) Date of Patent: Mar. 11, 2014

(54) FAST RECOVERY REDUCED P-N JUNCTION RECTIFIER

(75) Inventor: Ho-Yuan Yu, Saratoga, CA (US)

(73) Assignee: Ho-Yuan Yu, Saratoga, CA (US)

( * ) Notice: Subject to any disclaimer, the term of this patent is extended or adjusted under 35 U.S.C. 154(b) by 207 days.

(21) Appl. No.: 13/348,635

(22) Filed: Jan. 11, 2012

(65) Prior Publication Data

US 2012/0104456 A1     May 3, 2012

Related U.S. Application Data

(60) Continuation-in-part of application No. 12/960,488, filed on Dec. 4, 2010, now abandoned, which is a division of application No. 11/801,023, filed on May 8, 2007, now Pat. No. 7,880,166.

(60) Provisional application No. 60/799,252, filed on May 10, 2006.

(51) Int. Cl.
*H01L 29/861* (2006.01)
*H01L 29/864* (2006.01)

(52) U.S. Cl.
USPC 257/44; 257/483; 257/E29.327; 257/E29.211

(58) Field of Classification Search
USPC ............. 257/44, 109, 483, E29.327, E29.211
See application file for complete search history.

(56) References Cited

U.S. PATENT DOCUMENTS

| 4,259,680 | A | 3/1981 | Lepselter et al. |
|---|---|---|---|
| 4,483,726 | A | 11/1984 | Isaac et al. |
| 4,581,319 | A | 4/1986 | Wieder et al. |
| 4,729,965 | A | 3/1988 | Tamaki et al. |
| 5,024,957 | A | 6/1991 | Harame et al. |
| 5,098,854 | A | 3/1992 | Kapoor et al. |
| 5,101,256 | A | 3/1992 | Harame et al. |
| 5,162,876 | A | 11/1992 | Kitagawa et al. |
| 6,261,874 | B1 | 7/2001 | Francis et al. |
| 6,261,875 | B1 | 7/2001 | Zhang et al. |
| 6,271,061 | B1 | 8/2001 | Frisina et al. |
| 6,486,524 | B1 | 11/2002 | Ahmed |
| 6,498,367 | B1 | 12/2002 | Chang et al. |
| 6,525,389 | B1 * | 2/2003 | Ahmed .................. 257/486 |
| 6,603,153 | B2 | 8/2003 | Francis et al. |
| 6,670,650 | B2 | 12/2003 | Nemoto et al. |

(Continued)

FOREIGN PATENT DOCUMENTS

| JP | 2001-232652 | 8/2001 |
|---|---|---|
| TW | 460983 | 10/2001 |
| TW | 492198 | 6/2002 |
| TW | 503567 | 9/2002 |

*Primary Examiner* — Evan Pert
(74) *Attorney, Agent, or Firm* — Cheng Intellectual Property Group

(57) ABSTRACT

A fast recovery rectifier structure with the combination of Schottky structure to relieve the minority carriers during the forward bias condition for the further reduction of the reverse recovery time during switching in addition to the lifetime killer such as Pt, Au, and/or irradiation. This fast recovery rectifier uses unpolished substrates and thick impurity diffusion for low cost production. A reduced p-n junction structure with a heavily p-type doped thin film is provided to terminate and shorten the p-n junction space charge region. This reduced p-n junction with less total charge in the p-n junction to further improve the reverse recovery time. This reduced p-n junction can be used alone, with the traditional lifetime killer method, with the Schottky structure and/or with the epitaxial substrate.

15 Claims, 12 Drawing Sheets

(56) References Cited

U.S. PATENT DOCUMENTS

| | | |
|---|---|---|
| 6,686,614 B2 | 2/2004 | Tihanyi |
| 6,699,755 B1 | 3/2004 | Chiou et al. |
| 6,855,970 B2 | 2/2005 | Hatakeyama et al. |
| 6,870,199 B1 | 3/2005 | Yoshikawa et al. |
| 6,927,141 B2 | 8/2005 | Andoh et al. |
| 7,034,376 B2 | 4/2006 | Okada et al. |
| 7,820,473 B2 | 10/2010 | Chen et al. |
| 7,880,166 B2 * | 2/2011 | Yu .................... 257/44 |
| 2006/0255423 A1 | 11/2006 | Ryu et al. |
| 2009/0146241 A1 * | 6/2009 | Yoshii .................... 257/476 |

* cited by examiner

FAST RECOVERY REDUCED P-N JUNCTION RECTIFIER

CROSS REFERENCE TO RELATED APPLICATIONS

This application is a continuation-in-part of U.S. patent application Ser. No. 12/960,488, filed on Dec. 4, 2010, which is a divisional of U.S. patent application Ser. No. 11/801,023, filed on May 8, 2007. U.S. patent application Ser. No. 11/801,023 claims priority to U.S. provisional patent application Ser. No. 60/799,252 filed on May 10, 2006. Each of the above named priority document is incorporated by reference herein in its entirety.

BACKGROUND OF THE INVENTION

1. Field of the Invention

This invention relates generally to the structures of a fast recovery rectifier. This invention discloses the method of reducing the reverse recovery time from a conventional fast recovery rectifier by either introducing the Schottky structure at the front and/or the back of the substrate or introducing the junction termination layer to reduce the total space charge (or built-in potential) of the p-n junction. Furthermore, this invention also provides the low cost manufacturing of a very fast recovery rectifier.

2. Description of Related Art

FIG. 1 shows the cross section of a conventional fast recovery rectifier. The doped substrate 100 is made by either n type or p type material. The doped substrate 100 used is a wafer with sawed or unpolished rough surface treatment for cost savings. The polish of the wafer surface is not required in this case. Doping of wafer can be done by either film method or by standard deep diffusion method. The p-n junction 103 can be formed on the doped substrate 100, and the depth of the p-n junction 103 is usually from less than 10 microns to over 20 microns so that the depth of the p-n junction 103 is deeper than the surface damaged region of the rough surface. Then the lifetime killer such as Pt, Au, etc. is added to the wafer with thermal treatment. The reverse recovery time is depending on doping concentration, the thermal treatment temperature, and time of the lifetime killer species. The other method for the lifetime reduction can also be done by irradiation of electrons or other species. After the irradiation treatment, the substrate is being processed by annealing.

The diffusion to the doped substrate 100 is generally using opposite polarity species at the p-n junction 103. The depth of this p-n junction 103 should be deeper than the surface damage region for the reduction of the leakage current. The diffusion to the doped substrate 100 is generally using the same polarity as at the backside layer 101. The passivation layer 104 can be formed after the formation of the p-n junction 103 as well as the life time killer process. The irradiation of the electrons and or other species can be done after the process of the wafer or even in the packaged parts. The passivation layer 104 can be done by conventional glass passivation process or multiple CVD process. The top metal layer 105 is deposited, evaporated, sputtered, or plated along with the top of the p-n junction 103. The bottom layer 105B metallization is to be done by similar metallization process or by nickel plating. After the completion of the process, the wafer is diced into chips for assembly.

FIG. 2 shows the cross section of an epitaxial based fast recovery rectifier in prior art. The epitaxial layer 102 has the same polarity and is grown on the heavily doped substrate 100. The doping concentration and the thickness of the epitaxial layer 102 are determined by the breakdown voltage. The epitaxial layer 102 can be made by single or multiple layers. The p-n junction 103 anode diffusion can be done by either ion implantation or diffusion method of the opposite polarity to the epitaxial layer 102. After the formation of the p-n junction 103 anode diffusion, the life time killer such as Pt, Au or other species with proper thermal treatment can be added to the wafer. After the p-n junction diffusion, the deep etched structure is to be done by wet etch prior to the passivation process. The passivation layer 104 is done either by the conventional glass passivation or multiple CVD layers method. The top metal layer 105 is then opened for the metallization. The top metal layer 105 can be done by the contact metallization using either Ti—TiN—Al, TiNiAg or Nickel plating for either wire bond or soldering. The backside layer 101 can be done by the implantation of similar polarity to the silicon doped substrate 100 or omitted if the doped substrate 100 is heavily doped. The bottom layer 105B metallization is done either by Ti—Ni—Ag or Cr—Au or by Ni plating. After the completion of the process, the wafer is then ready for the dicing and assembly.

U.S. Pat. No. 6,261,874, Francis and Ng disclosed the fast recover diode structure with both Beam Radiation defects and He implanted defects to reduce the reverse recovery time. With this structure, the soft recovery time can result. U.S. Pat. No. 6,486,524 Ahmed disclosed the complicated structure using p-n junction as well as the Al or Pd Schottky for the fast reverse recovery time. U.S. Pat. No. 6,603,153, Francis and Ng disclosed the fast recovery rectifier structure that is similar to U.S. Pat. No. 6,261,875. U.S. Pat. No. 6,699,755 Bol disclosed a fast recovery diode structure similar to U.S. Pat. No. 6,486,524. U.S. Pat. No. 6,870,199 Yoshikawa et al disclosed the multiple life time control region for the improvement of di/dt caused breakdown. U.S. Pat. No. 6,927,141 Andoh et al disclosed the termination structure by using equal metal ring.

SUMMARY OF THE INVENTION

A rectifier having an n-type epitaxial semiconductor substrate has a plurality of first p-type semiconductor regions disposed in the n-type epitaxial semiconductor substrate. The rectifier further includes a second p-type semiconductor layer which is disposed in the n-type epitaxial semiconductor substrate and is separated into a plurality of segments by the plurality of first p-type semiconductor regions. The second p-type semiconductor layer has a smaller depth than each first p-type semiconductor region and the doping concentration of the first p-type semiconductor is higher than the second p-type semiconductor. The rectifier further includes a third p-type semiconductor layer disposed above both the plurality of first p-type semiconductor regions and the second p-type semiconductor layer. The third p-type semiconductor layer has smaller depth than the second p-type semiconductor layer and higher doping concentration than each first p-type semiconductor region.

DETAILED DESCRIPTION OF THE PREFERRED EMBODIMENT

Embodiment One

Figure 1:
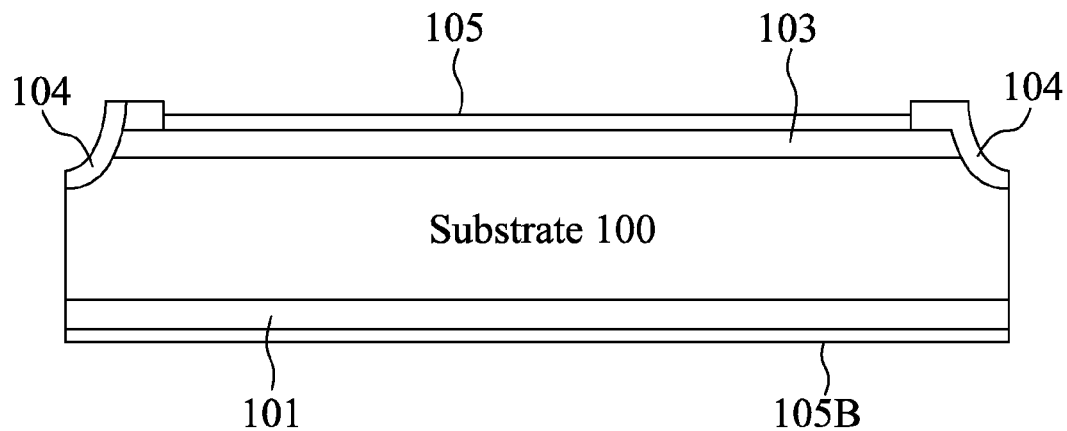
FIG. 1 shows a cross section of a conventional fast recovery rectifier.
Figure 2:
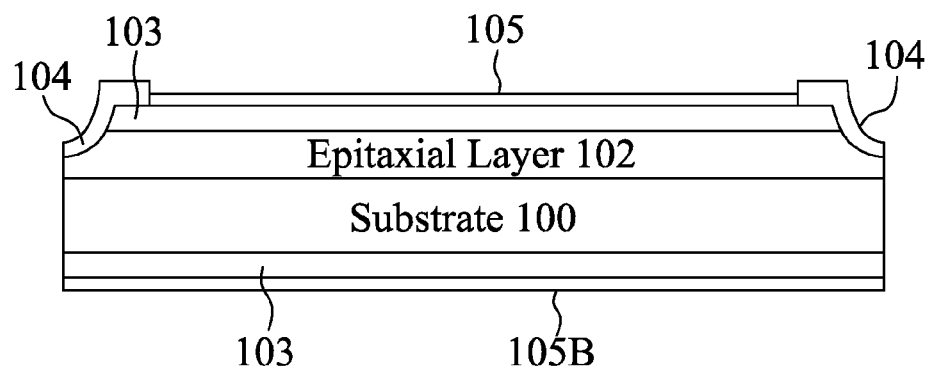
FIG. 2 shows a cross section of an epitaxial based fast recovery rectifier in prior art.
Figure 3:
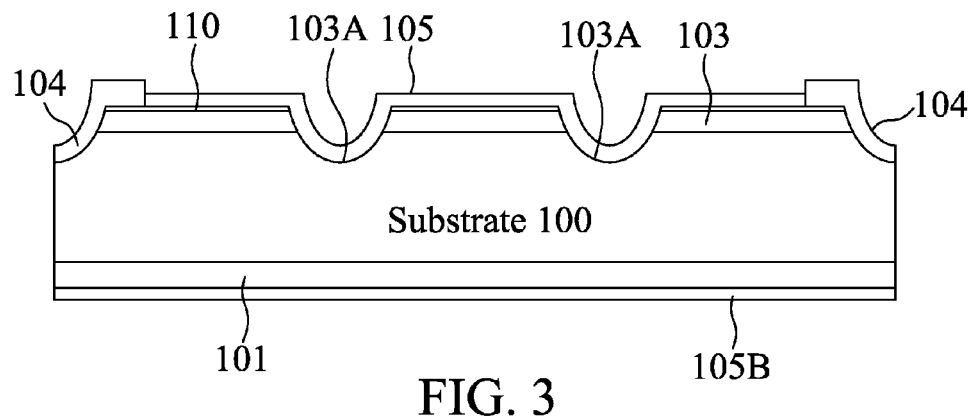
FIG. 3 illustrates the cross-sectional view of a fast recovery rectifier in accordance with one or more embodiments.

FIG. 3 is a cross-sectional view of the present invention fast recovery rectifier that is different from the FIG. 1 in the etched structure 103A. In addition, the etched structure 103A of FIG. 3 can be etched (preferred by wet etch) either in round, hexagon, strip or other shapes. The diameter or the width of the etched structure is generally larger than twice the depth of the p-n junction 103. In general, it is over 20 microns.

The p-n junction 103 is deposited, evaporated, sputtered, or plated along with the top metal layer 105. The p-n junction 103 is terminated early by a very thin and heavily doped layer 110 with the same polarity as 103. This layer 105 can be finished by contact metal and/or barrier metal and/or top metal for soldering or wire bonding. The backside layer 101 is to be done by similar metallization process or by nickel plating. After the completion of the process, the wafer is diced into chips for assembly.

Embodiment Two

Figure 4:
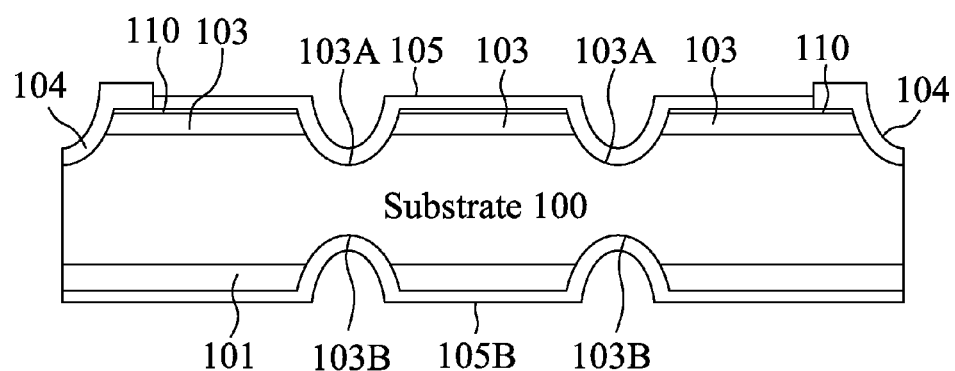
FIG. 4 illustrates a cross section similar to FIG. 3 except the back side of the wafer is also etched like the top surface.

FIG. 4 discloses a cross section similar to FIG. 3 except the back side of the wafer is also etched like the top surface. The purpose for this structure is to get the addition of the Schottky surface to absorb the minority carrier at the backside of the chip. The location of the etched structure 103B is not necessary to be aligned with the top surface structure 103A. The shape of the etched structure 103B can be round, hexagon, stripe or other structures depending on the requirement. Both FIG. 3 and FIG. 4 of the present invention offer the low cost versions of the fast recovery rectifiers.

Embodiment Three

Figure 5:
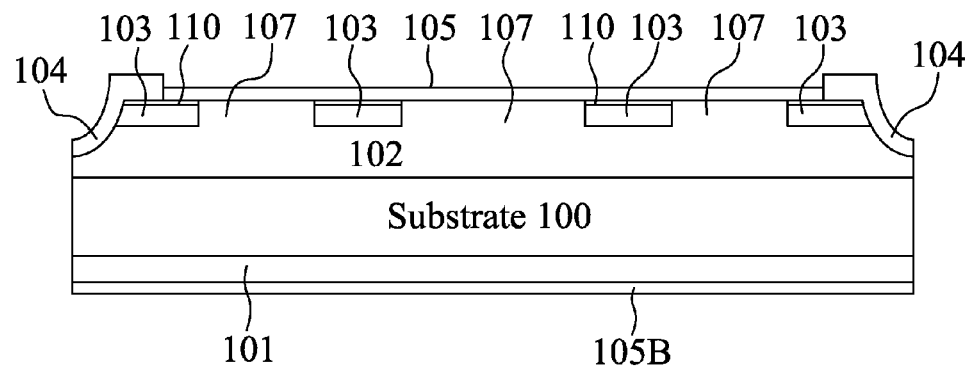
FIG. 5 illustrates a cross section of an epitaxial based fast recovery rectifier in accordance with one or more embodiments.

FIG. 5 discloses a cross section of an epitaxial based fast recovery rectifier. The epitaxial layer 102 has the same polarity and is grown on the heavily doped substrate 100. The doping concentration and the thickness of the epitaxial layer 102 are determined by the breakdown voltage. The epitaxial layer 102 can be made by single or multiple layers. The p-n junction anode diffusion 103 can be done by either ion implantation or diffusion method of the opposite polarity to the epitaxial layer 102 using silicon dioxide as the mask. The p-n junction 103 is terminated early by a very thin and heavily doped layer 110 with the same polarity as 103. For the ion implantation, the photo resist can be used in addition to the oxide layer as the mask. The Schottky contact region 107 is the masked region of photo resist and oxide layer. This masked Schottky contact region 107 is used for the Schottky contact.

In this embodiment, after the formation of the p-n junction anode layer, the life time killer such as Pt, Au or other species with proper thermal treatment can be added to the wafer. On the other hand, after the top layer diffusion, the deep etched structure is to be done by etching, preferably by wet etch prior to the passivation process. The passivation layer 104 is done either by the conventional glass passivation or multiple CVD layers method.

Next, the top metal layer 105 is then opened for the metallization. The top metal layer 105 can be done by the Schottky contact metallization with either Pt, Au, Ni, Mo, W, Cr, Ti etc. followed by the barrier metal layer such as TiW, TiN, and the top metal such as Al, Ag, etc. for either wire bond or soldering. The backside layer 101 can be done by the implantation of similar polarity to the silicon substrate or omitted if the substrate is heavily doped. The bottom layer 105B is done either by Ti—Ni—Ag or Cr—Au or by Ni plating. After the completion of the process, the wafer is then ready for the dicing and assembly.

Figure 6A:
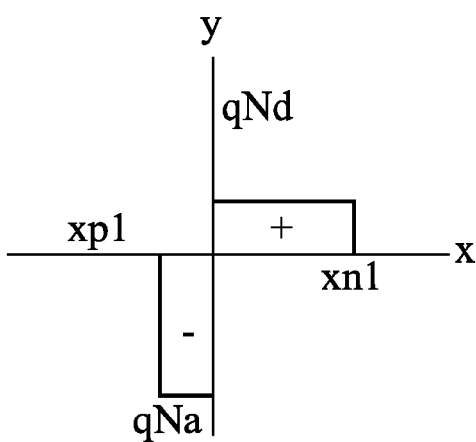
FIG. 6A illustrates the normal charge diagram of a p-n junction.
Figure 6B:
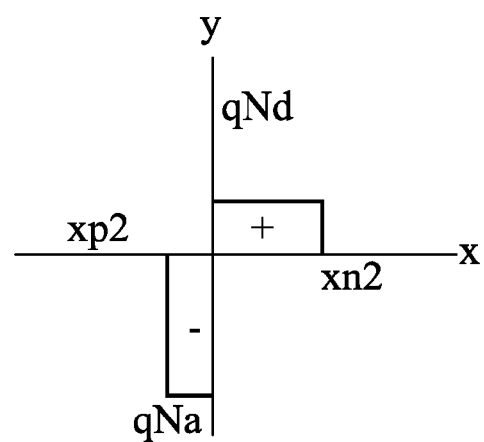
FIG. 6B illustrates the charge diagram of a reduced p-n junction.

FIG. 6A illustrates a normal charge diagram of a p-n junction. The total area of $qNa \times xp1$ at p region is equal to that of $qNd \times xn1$ at the n region. Na is the doping concentration of the p region and xp1 is the charge distance of the p region. By using a heavily doped p layer to make the distance xp2 of p region smaller, the total area of $qNa \times xp2$ is smaller than that of $qNa \times xp1$ with same doping level of Na. In order to balance the total charge, $qNd \times xn2$ is the same as $qNa \times xp2$. Nd is the doping concentration of n region and xn is the charge distance of the n region. Thus the built-in potential of FIG. 6B is smaller than the built-in potential of FIG. 6A. In order to get good ohmic contact, this very thin layer of $P^{++}$ at xp2 must be presented and the same is true for n-p junction. Reduced p-n junction is made by the following conditions: (a) The doping concentration of p region of said reduced p-n junction is in the magnitude from 2 to 10 times the magnitude of the n region, and this can be accomplished by lightly doped implant with low energy and dose—the energy of the implant is from 500 eV to 50 KeV with implant dose from 1.0E12 to 1.0E15 per $cm^2$, and light implant anneal is done by either RTA or furnace in inert ambient. Then, a very shallow p++ region is placed on the top of the p region and the implant dose is from 1.0E12 to 1.0E15 per $cm^2$ with the energy from 100V to 35 KeV, then implant anneal is done by RTA. The heavily doping concentration but very shallow p type region can be used to terminate said p-n junction; (b) Using the heavily doping concentration but very shallow p type region, the heavily doping concentration but very shallow p type region may use low temperature p++ type diffusion with the temperature from 700 deg. C. to 1100 deg C. and time from 60 seconds to one hour with furnace or RTA diffusion. Said reduced p-n junction ranged from 0.5 eV. to 0.9 eV.

Figure 6C:
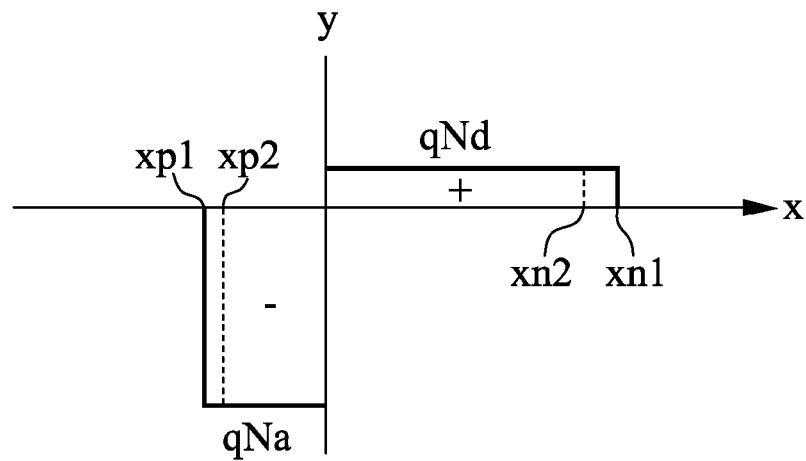
FIG. 6C to 6E illustrates the differences of electrical field and built-in potential between a normal p-n junction and a reduced p-n junction.
Figure 6D:
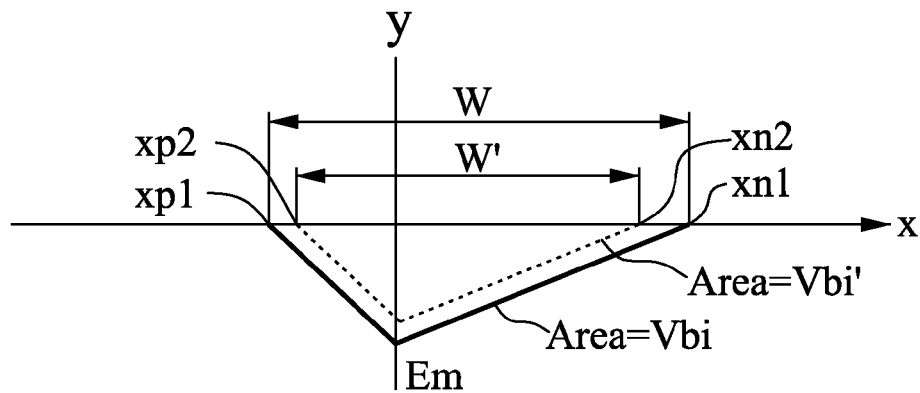
Figure 6E:
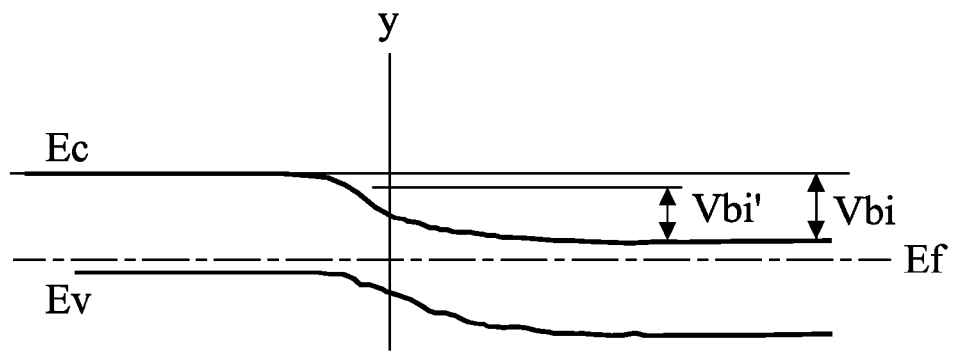

FIG. 6C illustrates the charge diagrams of both normal p-n junction and reduced p-n junction. The solid line of FIG. 6C depicts the charge diagram of a normal p-n junction (i.e. FIG. 6A) while the dotted line depicts the charge diagram of a reduced p-n junction (i.e. FIG. 6B). FIG. 6D shows the corresponding built-in potentials for normal and reduced p-n junctions. The area of solid line triangle is the built-in potential Vbi of the normal p-n junction and the area of dotted line triangle is the built-in potential Vbi' of the reduced p-n junction. FIG. 6E shows the corresponding energy diagrams of both the normal and reduced p-n junctions in equilibrium condition. Because the reduced p-n junction is terminated early at xp2 on p-side, the built-in potential Vbi' is lower than that of normal p-n junction Vbi. The early junction termination is achieved by using a very shallow and heavily doped $p^{++}$ layer on p-side to provide an Ohmic contact to the metallization layer. Otherwise, a Schottky contact with different polarity to the metallization layer could happen and cannot achieve the requirement for a good p-n junction. The concept of reduced p-n junction with terminator is used in all embodiments.

Figure 7:
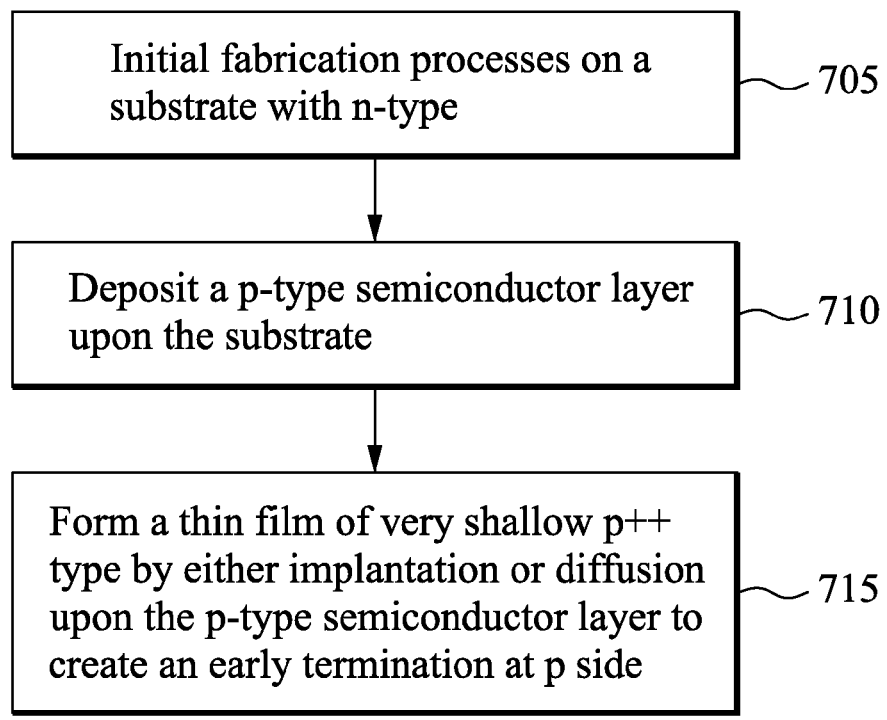
FIG. 7 illustrates a flow chart of a method of manufacturing a reduced p-n junction of a fast recovery rectifier in accordance with one or more embodiments.

FIG. 7 illustrates a flow chart of a method of manufacturing a reduced p-n junction of a rectifier as described earlier in FIG. 6A-6E. As depicted in FIG. 7, the fabrication process may begin, at 705 with various initial processes upon a semiconductor substrate. At 710, a p-type semiconductor layer is deposited on the n-type substrate to form a p-n junction. At 715, a very shallow but heavily doped $P^{++}$ layer is deposited on top of the p-type semiconductor layer by either implantation or diffusion. This shallow and thin layer of $P^{++}$ type can terminate the p-n junction early and thus reduce the built-in potential of the p-n junction.

Referring to embodiments four and five to be described below. The planner termination structure for high voltage guard ring either is using single or multiple guard rings for the epitaxial wafer. The epitaxial layer or multiple epitaxial layers is deposited on the similar polarity substrate under the condition—the implant dose of the opposite polarity region ranging from less than 1E+10 per $cm^2$ to 1E+16 per $cm^2$ with the implant energy from 100 V to over 100 KeV and time 10 seconds to one hour with the temperature from 600 to 1100 deg C. to form the p-n junction or the Schottky region by blocking the implant species, and the implant condition for the guard ring can be the same as the opposite polarity base material.

Embodiment Four

Figure 8:
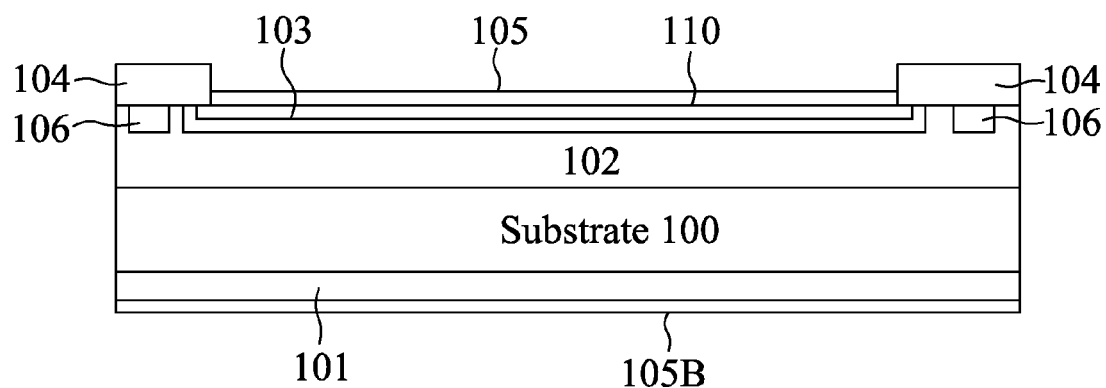
FIG. 8 illustrates a cross section of an epitaxial based fast recovery rectifier by using guard rings as the termination structure in accordance with one or more embodiments.

FIG. 8 disclosed a cross section of an epitaxial based fast recovery rectifier by using guard rings as the termination structure. The insulation layer 104 is a thick oxide from 200 A to over 2 microns. This insulation layer 104 can be formed either by oxidation or CVD layers or both. The guard ring 106 structure is either single guard ring or multiple guarding rings depending on the requirement of the reverse blocking voltage. The guard ring 106 can be formed either by diffusion or implant. The implant dose for the guard ring 106 is from less than 1E+10 per $cm^2$ to over 1E+15 per $cm^2$ and the implant energy from less than 100V to over 100 KeV depending on the design requirement. The implant dose of the diode regions 103 is done from less than 1E+10 per $cm^2$ to over 1E+15 per $cm^2$ and the implant energy from less than 100V to over 100 KeV. This implant of diode regions 103 and guard ring 106 is in the opposite polarity to the base material of epitaxial layer 102. The diode termination layer 110 is a very heavy doped region with the same polarity of diode region 103. This diode termination layer 110 can be formed either by the implant energy from 100V to 50 KeV and the dose from 1E+11 per $cm^2$ to over 1E+15 per $cm^2$ or by diffusion with temperature from 700 deg C. to over 1100 deg C. and the time from over one hour to less than 30 seconds.

In this embodiment, the purpose of diode termination layer 103A is to terminate the p region into the narrower space, thus the total charge will be smaller. The lifetime killer such as Pt, Au, or can be added before or after the process. The top metal layer 105 can be either formed by Au, Pt, W, Mo Cr, Ni, Ti and other metal or used to form the silicide.

Next, the diffusion barrier such as TiW, TiN or other layer is done before the contact layer of the 105 is deposited. The contact layer of the 105 can be either Al for wire bonding or Ag or Au for soldering. The backside layer 101 is implanted or diffused with the similar polarity to the doped substrate 100. If the resistivity of the doped substrate 100 is lower enough, this layer 101 can be eliminated. The bottom layer 105B can be made by the similar metallization process used for the top metal layer 105 or by using convention method such as Cr—Au, Ti—Ni—Ag or even with Nickel plating.

Embodiment Five

Figure 9:
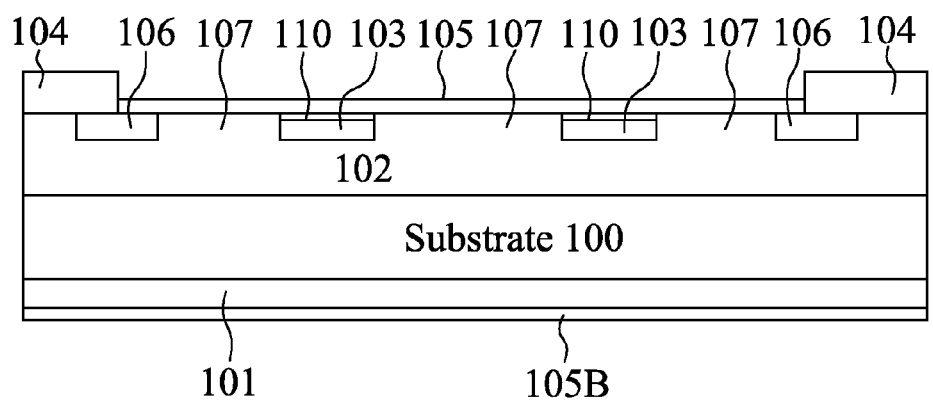
FIG. 9 illustrates a cross section of an epitaxial based fast recovery rectifier by using guard rings as the termination structure.

FIG. 9 discloses a cross section of an epitaxial based fast recovery rectifier by using guard rings as the termination structure. The insulation layer 104 is a thick oxide from 200 A to over 2 microns. The guard ring 106 structure is either single guard ring or multiple guarding rings depending on the requirement of the reverse blocking voltage. The guard ring 106 can be formed either by diffusion or implant. The implant dose for the guard ring 106 is from less than 1E+10 per $cm^2$ to over 1E+15 per $cm^2$ and the implant energy from less than 100V to over 100 KeV depending on the design requirement. The implant species is in the opposite polarity to the epitaxial layer 102. The Schottky contact region 107 can be either in round, hexagon, stripe or other shapes. The Schottky contact region 107 is formed by blocking implant during the formation of region 103, using either oxide and/or photoresist as the blocking layer. Region 103 is terminated early by a thin layer 110 which is heavily doped with same polarity as region 103. The size of 107 is designed by the needs of reverse recovery time. The top metal layer 105 can be either formed by Au, Pt, W, Mo Cr, Ni, Ti and other metal or used to form the silicide, and then followed by the diffusion barrier such as TiW, TiN or other layer before the contact layer is deposited. The contact layer can be either Al for wire bonding or Ag or Au for soldering. The backside layer 101 is a heavily doped region with the same polarity as the doped substrate 100 and the epitaxial layer 102. This layer can be done either by implantation or diffusion. If the resistivity of the substrate 100 is lower enough, this backside layer 101 can be eliminated. The bottom layer 105B uses the similar metallization process as the top metal layer 105 or uses convention method such as Cr—Au, Ti—Ni—Ag or even with Nickel plating. The lifetime killer such as Pt, Au or radiations can be added before or after the process.

Embodiment Six

Figure 10A:
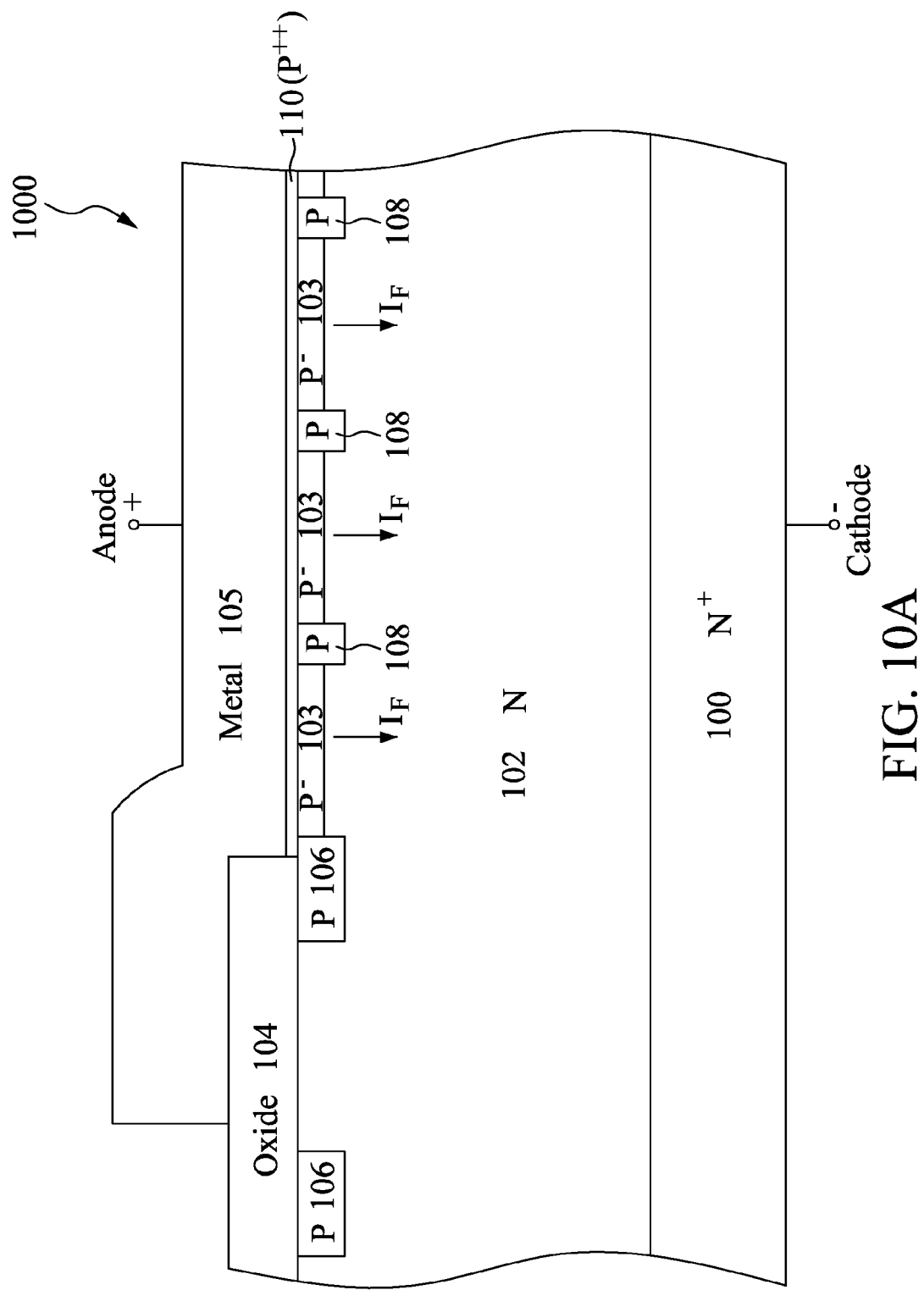
FIGS. 10A and 10B illustrate a cross section of a fast recovery rectifier in accordance with one or more embodiments.
Figure 10B:
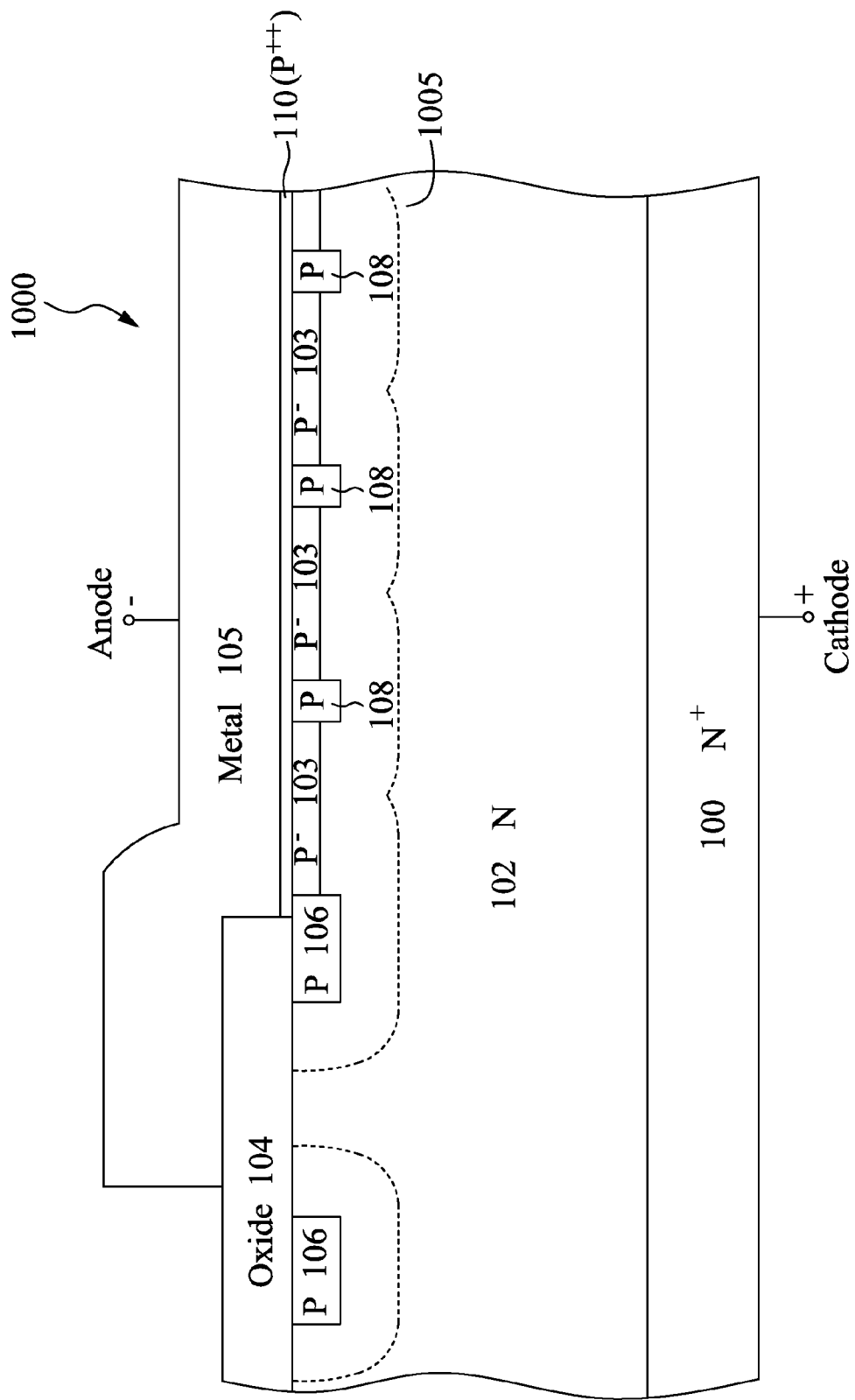

FIG. 10 illustrates a cross section of an epitaxial based rectifier 1000. FIG. 10A shows a state when forward voltage is applied and FIG. 10B shows a state when reverse voltage is applied. An epitaxial n-type layer 102 is deposited or grown on a heavily doped n-type substrate 100. The doping concentration and thickness of the epitaxial layer 102 are determined by the breakdown voltage. The doping concentration of the epitaxial layer 102 is uniform and roughly around 3E+14 per cm$^{-3}$. A plurality of narrow p regions 108 are created by ion implantation with silicon oxide or photo resist as mask between each p region 108. The p regions are uniformly separated from each other with a distance such that a depletion layer 1005 extending from p regions 108 to n-type layer 102 is pinched off and close the current channel which will be described later in FIGS. 10A and 10B. Subsequently, a lighter doping concentration of p$^-$ layer 103 is added to the originally masked area via implantation between p regions 108. The p$^-$ layer 103 has a smaller depth than each of the p region 108. Then, another layer of heavy doping concentration p$^{++}$ 110 is added to the top of both p regions 108 and p$^-$ layer 103. The depth of p$^{++}$ layer 110 is much shallower than the p$^-$ layer 103. As a result, the p$^{++}$ layer 110 creates an early termination at the p-n junction of current channel (i.e. the junction between p$^-$ layer 103 and n layer 102) to lower built-in potential as described in FIGS. 6A to 6E.

At one side of this rectifier 1000, a thick oxide layer 104 as an insulator and one or more floating p-type guard rings 106 are added to create an edge termination structure. The guard rings 106 can be formed by either diffusion or implantation. The process of creating this edge termination structure is similar but not limited to the embodiment described earlier in FIG. 9. This termination structure helps increase the reverse breakdown voltage and hence allows the depletion layer of p-n junctions (i.e. the junction between p regions 108 and n region 102) to expand. As a result, the leakage current during reverse bias can be further reduced. Because of the edge termination structure, the breakdown voltage of this rectifier 1000 can be increased to 600 V from 200 V for a typical rectifier. A top metal layer 105 is deposited on both p$^{++}$ layer 110 and oxide layer 104. The top metal layer 105 can be either formed by Au, Pt, W, Mo Cr, Ni, Ti and other metal or used to form the silicide, and then followed by the diffusion barrier such as TiW, TiN or other layer before the contact layer is deposited. The contact layer can be either Al for wire bonding or Ag or Au for soldering.

As shown in FIG. 10A, current I$_F$ (indicated by arrows) flow from anode through the current channels, the cross sections (metal 105/p$^{++}$ 110/p$^-$ 103/n 102/n$^+$ 100) between p regions 108 to cathode at the time of applying forward voltage. Because of the reduced p-n junction as described earlier, the forward turn-on voltage is reduced and thus the switching speed of rectifier improves.

On the other hand, FIG. 10B, at the time of applying reverse voltage, a depletion layer 1005 as indicated by dotted line extending from p regions 108 into n layer 102 and therefore close the current channels. In addition, the edge termination structure including oxide 104 and floating guard rings 106 help increase reverse breakdown voltage. As a result, the depletion layer 1005 can extend further than normal and reduce the leakage current in the current channels even more.

In summary, the junction structure of p$^{++}$ 110/p$^-$ 103/n 102 helps lower built-in potential (or lower forward turn-on voltage) while the junction structure of p 108/n 102 and termination structure (insulator 104 and guard rings 106) helps improve reverse breakdown voltage and reduce leakage current. In addition, p$^{++}$ layer creates an Ohmic contact between metal and p-type semiconductor. Because the junction structure of p$^{++}$ 110/p$^-$ 103/n 102 has much lower built-in potential than the junction structure of p 108/n 102 which will be described later in FIG. 13, majority of current will flow through the junction structure of p$^{++}$ 110/p$^-$ 103/n 102 (i.e. the current channel).

Figure 11A:
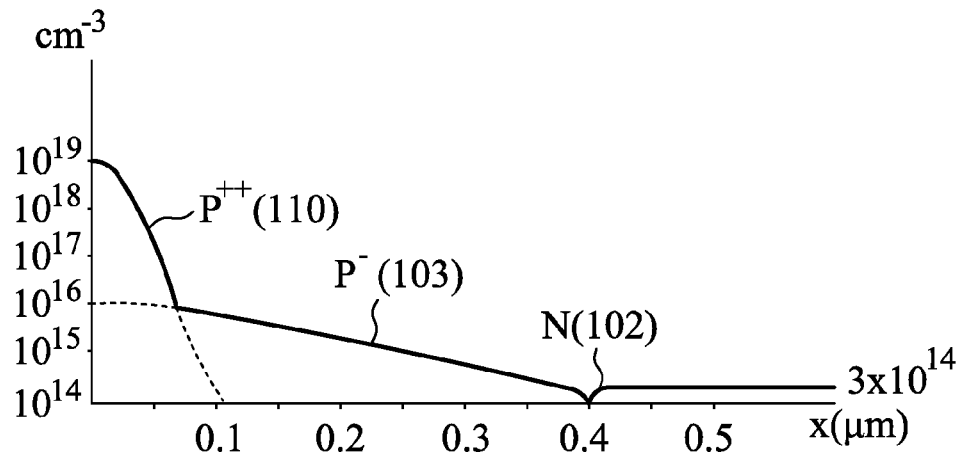
FIGS. 11A and 11B illustrate the doping concentration profile of the rectifier of FIG. 10.

FIG. 11A illustrates the doping concentration profile for the cross section of p$^{++}$ 110/p$^-$ 103/n 102. The p$^{++}$ layer 110 may be implanted with a very high concentration of approximately 1E+19 cm$^{-3}$ at a very shallow depth approximately 0.1 um or less and is followed by a p$^-$ layer of doping concentration of approximately 1E+16 cm$^{-3}$ at the depth of roughly 0.3 um. The epitaxial n layer 102 has a uniform doping concentration of approximately 3E+14 cm$^{-3}$.

Figure 11B:
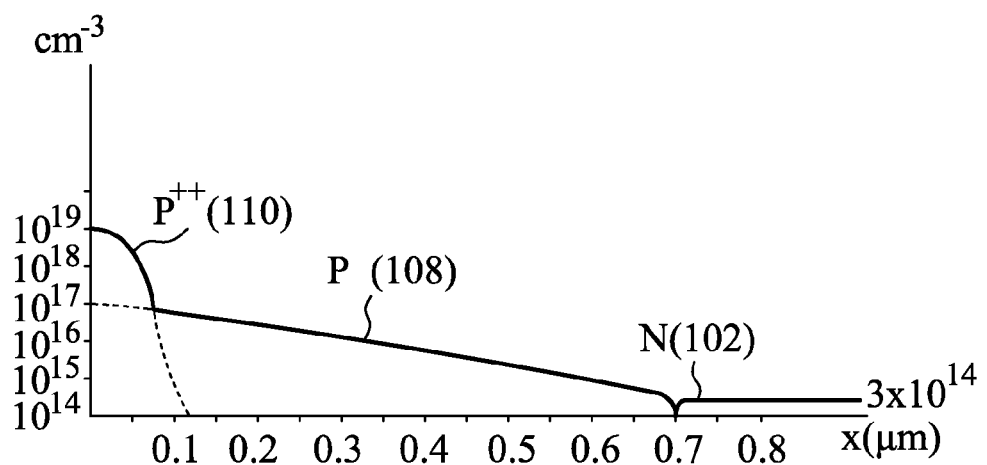

FIG. 11B shows the doping concentration profile for the cross section of p$^{++}$ 110/p 108/n 102. Similar to the doping profile of FIG. 11A, p$^{++}$ layer 110 has a doping concentration of approximately 1E+19 cm$^{-3}$ at a depth of approximately 0.1 um or less. Each p region 108 has a doping concentration of approximately 1E+17 cm$^{-3}$ at the depth of roughly 0.6 um. The epitaxial n layer 102 has a uniform doping concentration of approximately 3E+14 cm$^{-3}$.

Figure 12:
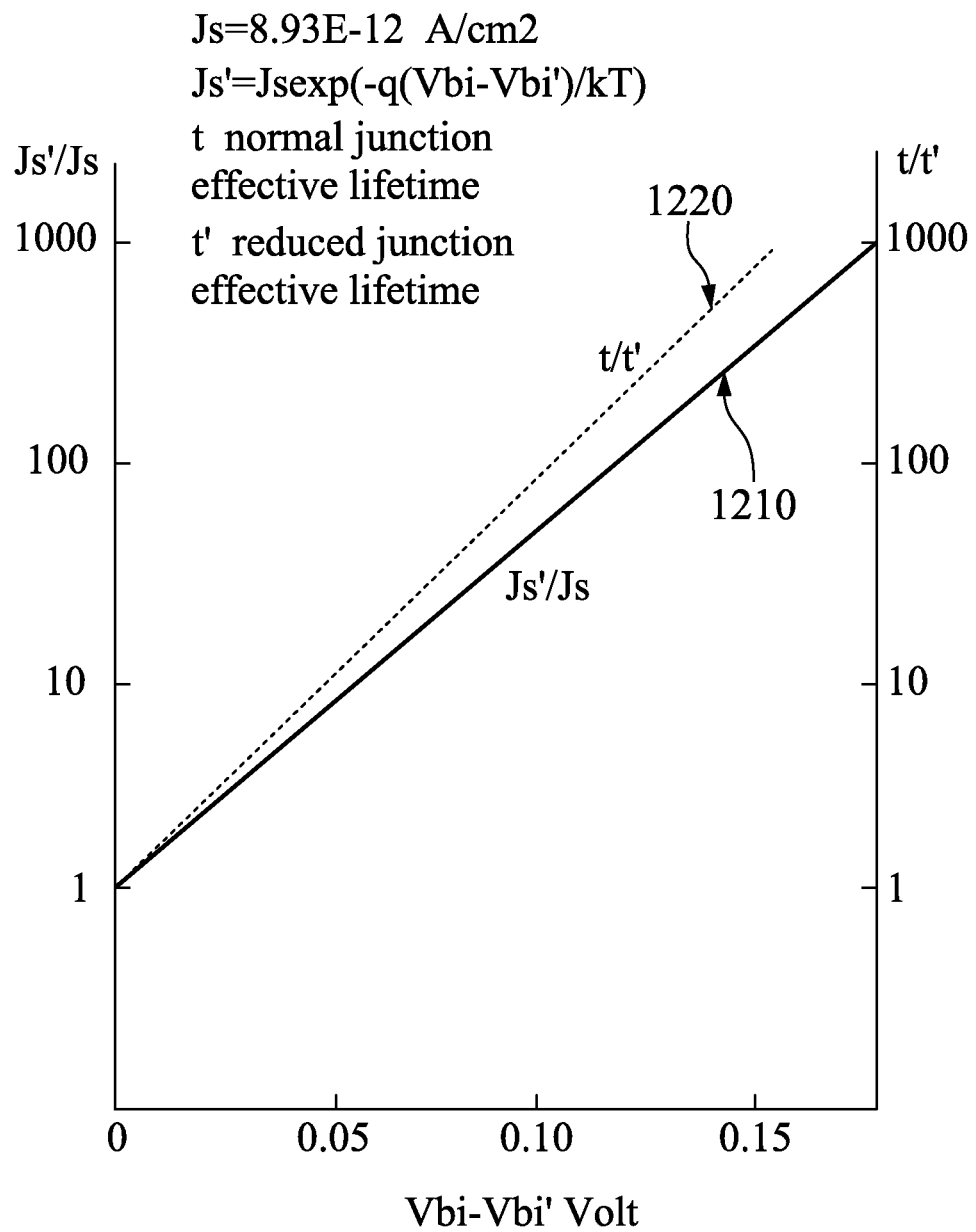
FIG. 12 illustrates the saturation current ratio and junction effective lifetime ratio with respect to the difference of built-in potentials.

FIG. 12 illustrates the impact of a lower built-in potential of a reduced p-n junction on both saturation current density and effective life time. The x-axis is the voltage difference between built-in potential (Vbi) of a normal p-n junction and the built-in potential (Vbi') of a reduced p-n junction. The solid line 1210 is the ratio of saturation current density (Js') of a reduced p-n junction over the saturation current (Js) of a normal p-n junction, and corresponds to the y-axis on left hand side. The dotted line 1220 is the ratio of the effective life time (t) of a normal p-n junction over the effective life time (t') of a reduced p-n junction, and corresponds to the y-axis on right hand side.

As shown in this figure, the reduced p-n junction's saturation current density (Js') which is the leakage current becomes larger as the built-in potential (Vbi') of the reduced p-n junction becomes smaller. The saturation current density can be expressed as the equation of Js'=Js exp(−qΔVbi/KT). Although the leakage current increases in the p-n junction, the actual leakage current flowing through the anode and cathode of a rectifier is prevented by the extended depletion regions as described earlier in FIG. 10. The effective life time (t') of a reduced p-n junction is reduced as the built-in potential (Vbi') of a reduced p-n junction becomes smaller.

Figure 13:
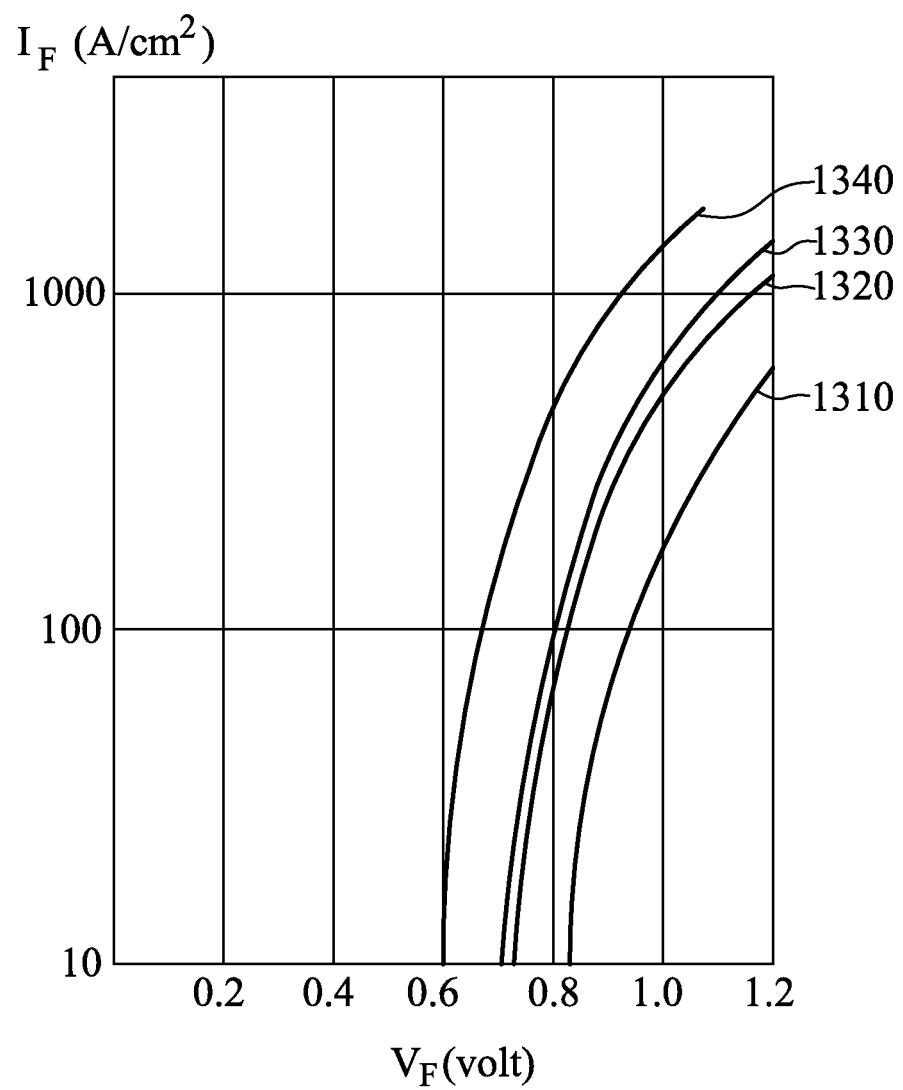
FIG. 13 illustrates the current-voltage characteristics of various types of p-n junctions.

FIG. 13 illustrates the current-voltage characteristics (I-V) of various types of p-n junctions referring to the p$^-$/n junction of FIG. 10. The first curve 1310 is the I-V characteristics of a normal p-n junction such as p 108/n 102 in FIG. 10. The second curve 1320 is the I-V characteristics of a p-n junction with p$^-$ only diffusion at 790° C. for 1 hour. The third curve 1330 is the I-V characteristics of a p-n junction with p$^-$ only diffusion at 810° C. for 30 minutes. The left most curve 1340 is the reduced p-n junction (p$^{++}$ 110/p$^-$ 103/n 102) as described in FIG. 10 which includes a p$^-$ layer via implantation plus a very shallow p$^{++}$ implantation on p side to terminate the p-n junction. As shown in FIG. 13, the forward turn-on voltage V$_F$ is lowered with p$^-$ diffusion and is reduced even further to roughly 0.6V for a reduced p-n junction (p$^{++}$/p$^-$/n) as compared to V$_F$ of 0.8 V or higher for a normal p-n junction.

Figure 14:
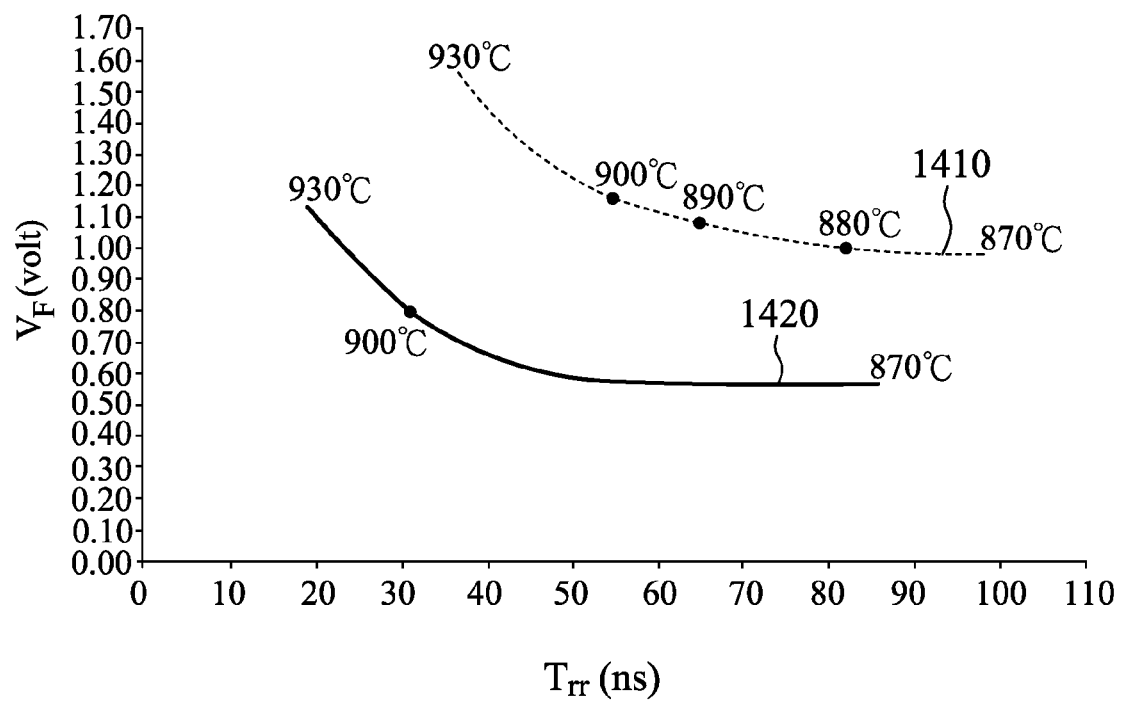
FIG. 14 illustrates the voltage and reverse recovery time characteristics of various types of p-n junctions.

FIG. 14 illustrates the characteristics of forward turn-on voltage (V$_F$) and reverse recovery time (Trr) with diffusion of life time killer Pt at various diffusion temperatures. The upper curve 1410 is the characteristics of a normal p-n junction and the lower curve 1420 is the characteristics of a reduced p-n junction. Normally, the higher the diffusion temperature, the higher the V$_F$ but the lower the Trr. As shown in this figure, diffusion of life time killer Pt at 900° C. into a reduced p-n junction not only lowers the V$_F$ but also the Trr.

The fast recovery rectifier of this invention is accomplished by one or more of following conditions;

Schottky structure is used with the standard fast recovery rectifier by using Pt, Au and/or radiation lifetime killer.

Reduced p-n junction is used with the standard fast recovery rectifier with Pt, Au, and/or radiation lifetime killer.

Reduced p-n junction is used with Schottky structure and standard fast recovery rectifier with Pt, Au and/or radiation lifetime killer.

Reduced p-n junction alone.

Reduced p-n junction is used with Schottky structure.

Reduced p-n junction is used with Schottky structure and standard fast recovery rectifier with Pt, Au and/or radiation lifetime killer with epitaxial substrates.

The fast recovery rectifier of this invention uses the Pt, Au and/or radiation lifetime killer, and combine with Schottky structure to reduce the minority carriers at the forward bias and in the rectifying process condition. The fast recovery rectifier use unpolished rough surface doped substrate and rough diffusion to provide a low cost. This invention is to form a reduced p-n junction space charge region by using a thin and very high doped film of the same polarity as the top junction layer which is opposite polarity to the base silicon substrate. This early termination of the junction charge region reduces the total space charge of the p-n junction, thus the smaller reverse recovery time can be achieved. This method can be used in conjunction with the life time killers and/or with the Schottky structures.

The present invention has been presented for purposes of illustration and description only. They are not intended to be exhaustive or to limit the present invention to the form disclosed. Accordingly, many modifications and variations will be apparent to practitioners skilled in the art. Additionally, the above disclosure is not intended to limit the present invention.

What is claimed is:

1. A rectifier, comprising:
   a n-type epitaxial semiconductor substrate;
   a plurality of first p-type semiconductor regions disposed in said n-type epitaxial semiconductor substrate;
   a second p-type semiconductor layer disposed in said n-type epitaxial semiconductor substrate and separated into a plurality of segments by said plurality of first p-type semiconductor regions, wherein said second p-type semiconductor layer has a smaller depth than each first p-type semiconductor region, wherein said doping concentration of said first p-type semiconductor is higher than said second p-type semiconductor; and
   a third p-type semiconductor layer disposed above both said plurality of first p-type semiconductor regions and said second p-type semiconductor layer, wherein said third p-type semiconductor layer has smaller depth than said second p-type semiconductor layer and higher doping concentration than each first p-type semiconductor region.

2. The rectifier of claim 1, wherein the built-in potential of junction between said second p-type semiconductor layer and said n-type epitaxial semiconductor substrate of said rectifier is lower than the built-in potential of a same type of junction without said third p-type semiconductor layer.

3. The rectifier of claim 1, wherein the built-in potential of junction between said second p-type semiconductor layer and said n-type epitaxial semiconductor substrate of said rectifier is lower than the built-in potential of junction between each first p-type semiconductor region and said n-type epitaxial semiconductor substrate of said rectifier.

4. The rectifier of claim 1, wherein said rectifier is a two-node device and current flows through junction of said second p-type semiconductor layer and said n-type epitaxial semiconductor substrate when forward voltage is applied.

5. The rectifier of claim 1, wherein said adjacent first p-type semiconductor regions are separate from each other at a distance at which a depletion layer between said first p-type semiconductor and said n-type epitaxial semiconductor is pinched off when reverse voltage is applied.

6. The rectifier of claim 1, further comprising an edge termination structure at one side of said n-type epitaxial semiconductor substrate, said edge termination structure comprising at least one fourth p-type semiconductor region disposed in said n-type epitaxial semiconductor substrate and an insulation layer disposed above said at least one fourth p-type semiconductor region, wherein said insulation layer and said third p-type semiconductor layer have no overlap.

7. The rectifier of claim 6, further comprising a metal layer disposed above both said third p-type semiconductor layer and said insulation layer, wherein current flows from said metal layer, through said second p-type semiconductor segments, to said n-type epitaxial semiconductor substrate when forward voltage is applied.

8. The rectifier of claim 6, wherein depletion layer of junction between said plurality of first p-type semiconductor regions and said n-type epitaxial semiconductor substrate of said rectifier is extended more than a same type of junction without said edge termination structure when reverse voltage is applied.

9. The rectifier of claim 1, wherein doping concentration of said third p-type semiconductor layer is approximately 1,000 times the doping concentration of said second p-type semiconductor layer.

10. The rectifier of claim 1, wherein depth of said plurality of first p-type semiconductor region is approximately 0.6 um.

11. The rectifier of claim 1, wherein depth of said second p-type semiconductor layer is approximately 0.3 um.

12. The rectifier of claim 1, wherein depth of said third p-type semiconductor layer is approximately 0.1 um or less.

13. A semiconductor device, comprising:
    a n-type epitaxial semiconductor substrate;
    a plurality of first p-type semiconductor regions disposed in said n-type epitaxial semiconductor substrate;
    a second p-type semiconductor layer disposed in said n-type epitaxial semiconductor substrate and separated into a plurality of segments by said plurality of first p-type semiconductor regions, wherein said second p-type semiconductor layer has a smaller depth than each first p-type semiconductor region, wherein said doping concentration of said first p-type semiconductor is higher than said second p-type semiconductor; and
    a third p-type semiconductor layer disposed above both said plurality of first p-type semiconductor regions and said second p-type semiconductor layer, wherein said third p-type semiconductor layer has smaller depth than said second p-type semiconductor layer and higher doping concentration than each first p-type semiconductor region.

14. The semiconductor device of claim 13, wherein the built-in potential of junction between said second p-type semiconductor layer and said n-type epitaxial semiconductor substrate of said rectifier is lower than the built-in potential of a same type of junction without said third p-type semiconductor layer.

15. The semiconductor device of claim 13, wherein the built-in potential of junction between said second p-type semiconductor layer and said n-type epitaxial semiconductor substrate of said rectifier is lower than the built-in potential of junction between each first p-type semiconductor region and said n-type epitaxial semiconductor substrate of said rectifier.

* * * * *